(12) United States Patent
Pan

(10) Patent No.: US 7,622,348 B2
(45) Date of Patent: Nov. 24, 2009

(54) METHODS FOR FABRICATING AN INTEGRATED CIRCUIT

(75) Inventor: James Pan, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 505 days.

(21) Appl. No.: 11/616,858

(22) Filed: Dec. 28, 2006

(65) Prior Publication Data

US 2008/0160688 A1 Jul. 3, 2008

(51) Int. Cl.
*H01L 21/8242* (2006.01)

(52) U.S. Cl. .............................. 438/241; 257/E21.646; 257/E21.678; 438/256; 438/399; 438/678

(58) Field of Classification Search .................. 438/241, 438/256, 399, 678; 257/E21.646, E21.678
See application file for complete search history.

(56) References Cited

U.S. PATENT DOCUMENTS 6,121,086 A * 9/2000 Kuroda et al. ............... 438/256
6,333,222 B1 * 12/2001 Kitazawa et al. ............ 438/241
6,506,647 B2 * 1/2003 Kuroda et al. .............. 438/275
6,518,130 B1 * 2/2003 Ohno ......................... 438/275
2004/0235259 A1 * 11/2004 Celii et al. .................. 438/396
2006/0211231 A1 * 9/2006 Asano et al. ................ 438/593

* cited by examiner

*Primary Examiner*—Asok K Sarkar
(74) *Attorney, Agent, or Firm*—Ingrassia Fisher & Lorenz, P.C.

(57) ABSTRACT

Methods are provided for reducing the aspect ratio of contacts to bit lines in fabricating an IC including logic and memory. The method includes the steps of forming a first group of device regions to be contacted by a first level of metal and a second group of memory bit lines to be contacted by a second level of metal, the first level separated from the second level by at least one layer of dielectric material. Conductive material is plated by electroless plating on the device regions and bit lines and first and second conductive plugs are formed overlying the conductive material. The first conductive plugs are contacted by the first level of metal and the second conductive plugs are contacted by the second level of metal. The thickness of the plated conductive material provides a self aligned process for reducing the aspect ratio of the conductive plugs.

20 Claims, 5 Drawing Sheets

United States Patent US 7,622,348 B2

METHODS FOR FABRICATING AN INTEGRATED CIRCUIT

TECHNICAL FIELD

The present invention generally relates to methods for fabricating integrated circuits, and more particularly relates to methods for fabricating integrated circuits having contacts with a reduced aspect ratio.

BACKGROUND

Integrated circuits (ICs) are made up of a plurality of interconnected transistors and other components. Complex ICs require several levels of metallization to properly interconnect all of the devices to power the devices, convey input and output signals, address and timing signals, and the like. The several levels of metallization are separated by layers of dielectric material (inter layer dielectric or ILD). Openings are selectively etched through the various ILD layers and those openings are filled with metal or other conductive material to route the signals between devices as needed to implement the desired circuit function.

As the complexity of ICs increases, the number of devices increases, the number of necessary interconnections increases, and the size of individual devices shrinks. Each generation of integrated circuits is characterized by a minimum feature size; that is the minimum line width or the minimum spacing between lines that is used in designing the individual devices. The reduction in feature size is not generally accompanied by a corresponding reduction in the thickness of layers used to fabricate the IC such as the thickness of metal layers, polycrystalline silicon layers, and ILD layers. Accordingly, the cross sectional area of the openings etched through ILD layers decreases more rapidly than the depth of the opening. The aspect ratio, the ratio of opening width to opening depth, thus increases as the IC size and complexity increases. High aspect ratio openings are difficult to reliably etch and fill with metal or other conductive material, leading to reliability issues and increased manufacturing cost.

Accordingly, it is desirable to provide reliable methods for manufacturing complex integrated circuits. In addition, it is desirable to provide self aligned methods for fabricating ICs with reduced aspect ratio contact openings. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for reducing the aspect ratio of contacts to a bit line in fabricating an IC including logic and memory. In accordance with one embodiment of the invention the method includes the steps of forming a first group of device regions to be contacted by a first level of metal and a second group of memory bit lines to be contacted by a second level of metal, the first level separated from the second level by at least one layer of dielectric material. Conductive material is plated by electroless plating in electrical contact with the device regions and the bit lines and first and second conductive plugs are formed overlying the conductive material. The first conductive plugs are contacted by the first level of metal and the second conductive plugs are contacted by the second level of metal. The thickness of the plated conductive material provides a self aligned process for reducing the aspect ratio of the conductive plugs and the conductive openings the plugs fill.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
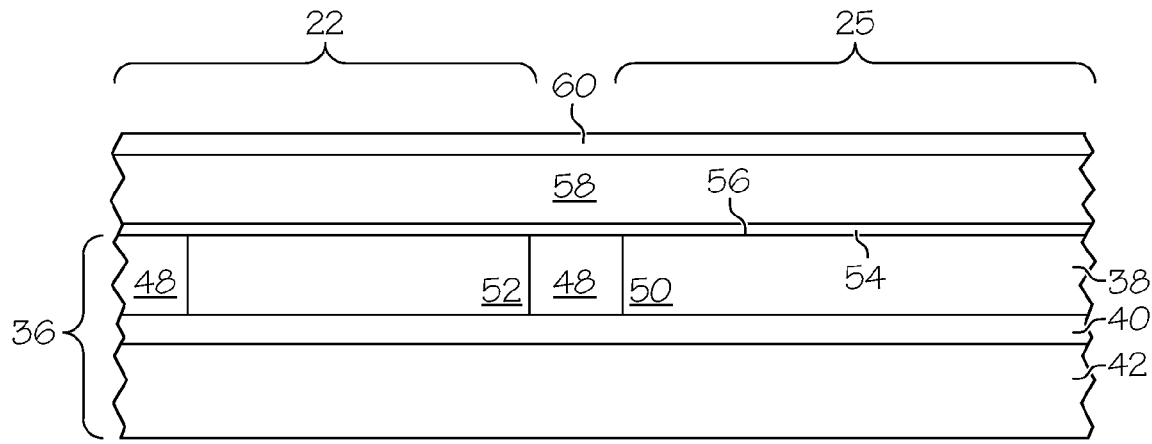
FIGS. 1-10 illustrate, in cross section, method steps, in accordance with various embodiments of the invention, for the fabrication of an integrated circuit.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-10 illustrate, in cross section, a portion of an integrated circuit (IC) 20 and method steps for its fabrication in accordance with various embodiments of the invention. For purposes of illustration only, IC 20 is an MOS integrated circuit, and in particular is a complementary MOS (CMOS) microprocessor integrated circuit including embedded dynamic random access memory (DRAM), although the invention also is applicable to other IC structures. Various steps in the manufacture of MOS circuits are well known and so, in the interest of brevity, many conventional steps will only be mentioned briefly herein or will be omitted entirely without providing the well known process details. Although the acronym "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Only a small portion of exemplary IC 20 will be described and illustrated in the figures. In a logic portion 22 of microprocessor IC 20 only a single MOS transistor 24 will be illustrated, and in a memory portion 25 of the IC only a single memory cell 26 will be illustrated. Memory cell 26 will be shown to include a word line 28, a bit line 30 and a memory storage capacitor 32. Those of skill in the art of fabricating MOS and other types of integrated circuits will understand that an IC such as IC 20 will include a significant number of transistors 24 and a significant number of memory cells 26. The memory portion of IC 20 typically includes a plurality of N-channel MOS (NMOS) transistors and the logic portion of the IC typically includes a plurality of NMOS transistors as well as a plurality of P-channel MOS (PMOS) transistors.

As will be explained below, the source and drain regions of logic transistor 24 as well as the memory storage capacitor may be coupled to one metal interconnect layer and the bit lines of memory cell 26 may be coupled to another metal interconnect layer with the two metal interconnect layers separated by at least one interlayer dielectric (ILD) layer. In prior art structures and methods the contact openings connecting, for example, the bit lines to an upper layer of metal interconnect have a high aspect ratio and are difficult to etch and to fill with a conductive material in a reliable and easily manufactured manner. In accordance with an embodiment of the invention the aspect ratio of contact openings, especially those previously having a high aspect ratio, is reduced by selectively depositing a conductive material on the contact areas in a self aligned manner to "prefill" the contact openings.

As illustrated in cross section in FIG. 1, the manufacture of CMOS IC 20 in accordance with an embodiment of the invention begins with providing a semiconductor substrate 36 in and on which MOS transistor 24 and memory cell 26 are fabricated. The initial steps in the fabrication of MOS IC 20 are conventional and will not be described in detail. The semiconductor substrate is preferably a silicon substrate wherein the term "silicon substrate" is used herein to encompass the relatively pure silicon materials typically used in the semiconductor industry as well as silicon admixed with other elements such as germanium, carbon, conductivity determining dopant impurities, and the like. Semiconductor substrate 36 will hereinafter be referred to for convenience but without limitation as a silicon substrate although those of skill in the semiconductor art will appreciate that other semiconductor materials such as germanium, gallium arsenide, or other semiconductor material could be used. Silicon substrate 36 may be a bulk silicon wafer (not illustrated), or may be a thin layer of silicon 38 on an insulating layer 40 (commonly know as silicon-on-insulator or SOI) that, in turn, is supported by a carrier wafer 42. Thin silicon layer 38 typically has a thickness of less than about 100 nanometers (nm) depending on the circuit function being implemented, and in certain applications preferably has a thickness of about 50 nm or less. The thin silicon layer preferably has a resistivity of at least about 1-35 Ohms per square. The silicon can be impurity doped either N-type or P-type, but preferably is initially doped P-type. Dielectric insulating layer 40, typically silicon dioxide, preferably has a thickness of about 50-200 nm.

Isolation regions 48 are formed that extend through monocrystalline silicon layer 38 to dielectric insulating layer 40. The isolation regions are preferably formed by well known shallow trench isolation (STI) techniques in which trenches are etched into monocrystalline silicon layer 38, the trenches are filled with a dielectric material such as deposited silicon dioxide, and the excess silicon dioxide is removed by chemical mechanical planarization (CMP). STI regions 48 provide electrical isolation, as needed, between various devices of the CMOS circuit that are to be formed in monocrystalline silicon layer 38. As illustrated, the STI provides electrical isolation between what will become logic portion 22 of the IC and memory portion 25. Either before or after fabrication of the STI regions selected portions of silicon layer 38 can be impurity doped, for example by ion implantation. For example, P-type well 50 can be impurity doped for the fabrication of NMOS transistors of memory portion 25 of IC 20 and N-type well 52 can be impurity doped N-type for the fabrication of PMOS transistor 24 of logic portion 22. Additional wells (not illustrated) can be doped P-type for the fabrication of NMOS transistors of logic portion 22.

A layer of gate insulator 54 is formed on surface 56 of silicon layer 38. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited in known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 54 is here illustrated as a deposited dielectric material that deposits uniformly on surface 56 of silicon layer 38 as well as on the surface of STI region 48. The gate insulator material is typically 2-10 nm in thickness. In accordance with one embodiment of the invention a layer of gate electrode forming material 58, preferably polycrystalline silicon, is deposited onto the layer of gate insulator. Other electrically conductive gate electrode forming materials such as metals and metal silicides may also be deposited instead of polycrystalline silicon. The gate electrode forming material will hereinafter be referred to as polycrystalline silicon although those of skill in the art will recognize that other materials can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. A layer of hard mask material 60 such as a layer of silicon oxide or silicon nitride is deposited overlying the layer of polycrystalline silicon. The layer of hard mask material can be deposited, for example, by LPCVD or PECVD to a thickness of about 40-50 nm.

Figure 2:
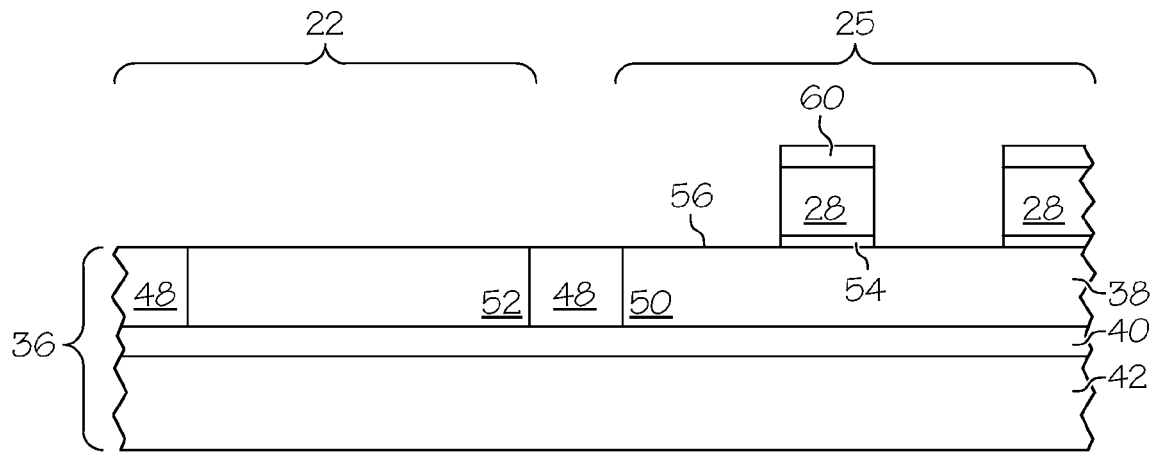
Figure 3:
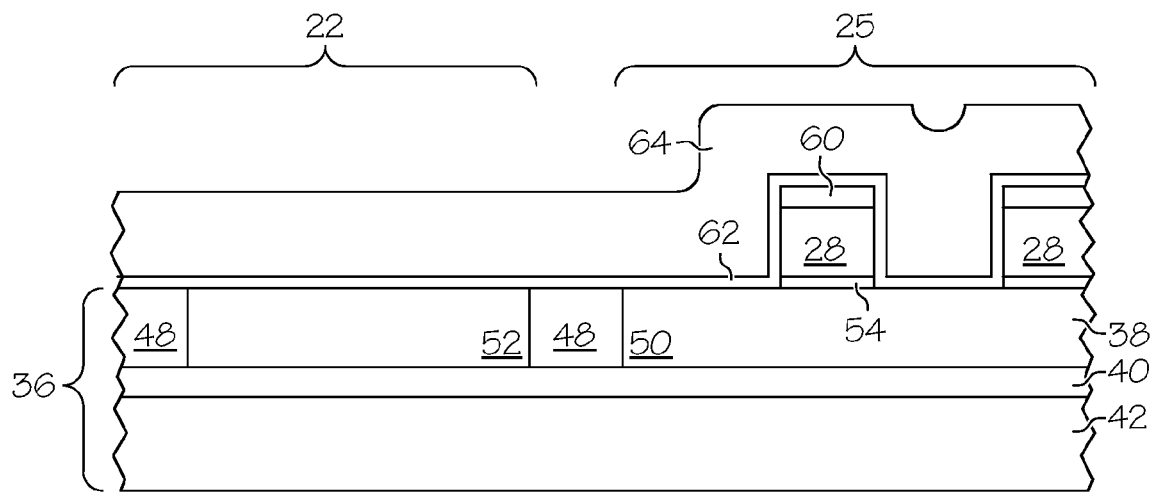

As illustrated in FIG. 2, the layer of hard mask material and the layer of polycrystalline silicon gate electrode forming material are patterned and etched to form word lines 28 in memory portion 25 of IC 20. The word lines are overlaid by the patterned hard mask material. The hard mask material and the polycrystalline silicon can be patterned by conventional photolithographic processing and can be etched by plasma etching. The hard mask material can be etched, for example, by using a using $CF_4$ or $CHF_3$ chemistry and the polycrystalline silicon can be etched by using a chlorine or $HBr/O_2$ chemistry. In a preferred embodiment the hard mask material, polycrystalline silicon layer, and gate insulator are removed from the logic portion of the IC.

The method in accordance with an embodiment of the invention continues, as illustrated in FIG. 3, by again forming a layer 62 of gate insulating material on surface 56 of silicon layer 38 in the logic portion of IC 20. Layer 62 can be thermally grown or can be deposited in the same manner and selected from the same materials as gate insulator layer 54. Gate insulator 62 is here illustrated as a deposited dielectric material that deposits uniformly on surface 56 as well as on STI region 48 and word line 28. Layer 62 can be about 1-10 nm in thickness and preferably is thinner than is gate insulator layer 54. A layer 64 of gate electrode forming material such as polycrystalline silicon is deposited over layer 62 of gate insulator material. The gate electrode forming material can have a thickness of about 50-200 nm and preferably has a thickness of about 100 nm.

Figure 4:
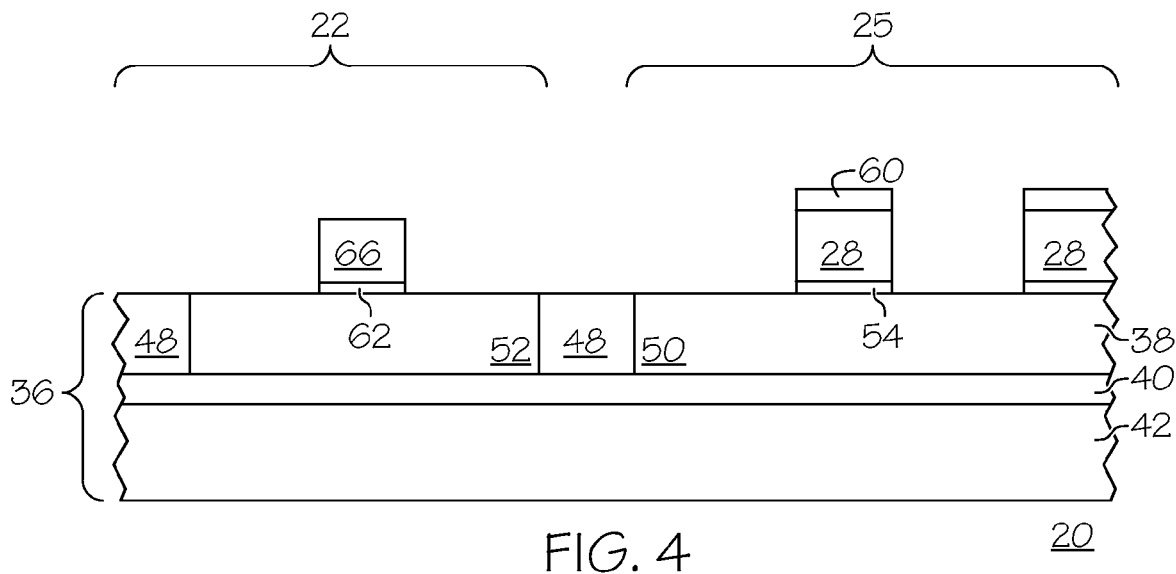

As illustrated in FIG. 4, layer 64 of gate electrode forming material is patterned and etched to form gate electrode 66 of MOS transistor 24 in the logic portion of IC 20 and to remove layer 64 from the memory portion of the IC. Hard mask layer 60 protects word line 28 during the etching of gate electrode forming material layer 64. Preferably gate insulator layer 54 is thicker than gate insulator layer 62 to minimize the leakage current in the memory portion of the circuit. In addition, the thin gate insulator of MOS transistors 24 in the logic portion of the IC maximizes the drive current capability and speed of the logic circuitry.

Following the patterning of gate electrodes 66 a layer of sidewall spacer forming material (not illustrated) is blanket deposited over the structure including over word line 28 and gate electrodes 66. The sidewall spacer forming material can be, for example, silicon dioxide, silicon nitride, silicon oxynitride, or other dielectric material. The sidewall spacer forming material can be deposited, for example, by LPCVD to a thickness of about 40-50 nm. The sidewall spacer forming material is anisotropically etched, for example by reactive ion etching (RIE) using a $CHF_3$, $CF_4$, or $SF_6$ chemistry to form sidewall spacers 68 on the side walls of word lines 28 and sidewall spacers 70 on the side walls of gate electrodes 66 as illustrated in FIG. 5.

Figure 5:
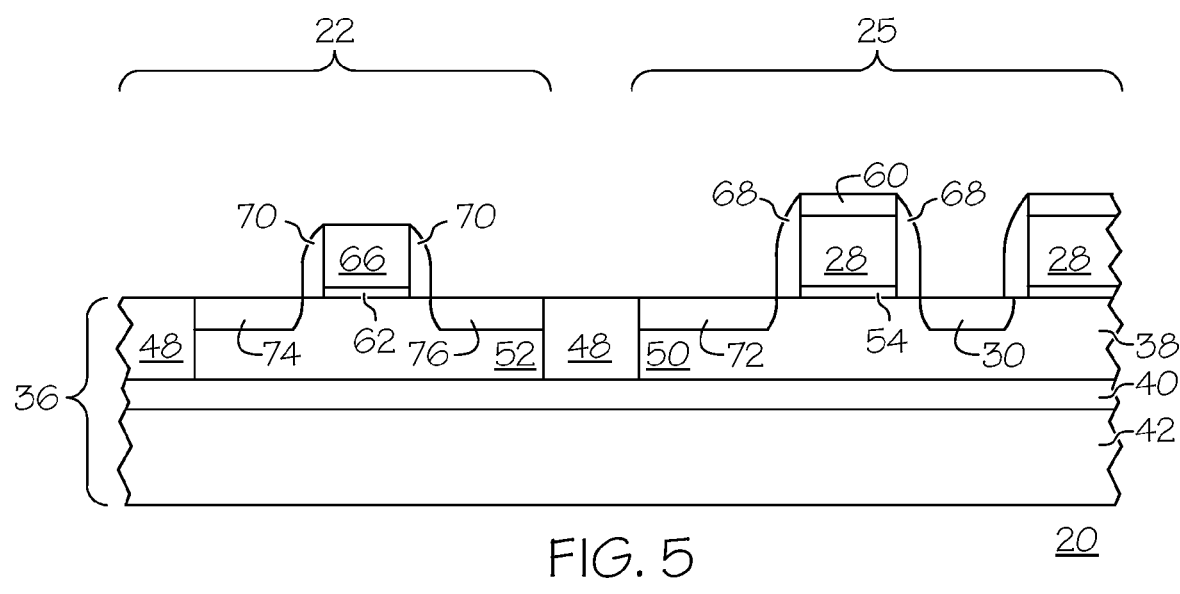

Sidewall spacers 68, word line 28, and STI 48 are used as an ion implantation mask and N-type conductivity determining ions such as arsenic ions or phosphorous ions are implanted into thin silicon layer 38 to form a memory storage capacitor contact 72 and a bit line 30 as illustrated in FIG. 5. The same ion implantation can be used to form the source and drain regions (not illustrated) of the NMOS transistors of the logic portion of IC 20. During the N-type implantation other parts of the IC structure such as the PMOS transistors of the logic portion can be masked with a patterned photoresist layer in conventional manner. The masking photoresist is removed and another layer of photoresist (not illustrated) is applied and patterned to mask the memory cells and the NMOS transistors of logic portion 22. Sidewall spacers 70, gate electrodes 66, and STI 48 are used as an ion implantation mask and P-type conductivity determining ions such as boron ions are implanted into thin silicon layer 38 to form source 74 and drain 76 regions of PMOS transistor 24. As those of skill in the art will understand, the order of the N-type and P-type implantations can be reversed. Although only one set of side wall spacers and one ion implantation have been illustrated for each portion of the IC, those of skill in the art will recognize that additional spacers and implantations can be used to form halo implants and drain extensions, set threshold voltage, and the like. Sidewall spacers 68 and 70 can also be used as an etch mask to remove any oxide or other material from and to expose the surface of the source and drain regions, bit lines, and surface portion of the memory storage capacitor contact.

Figure 6:
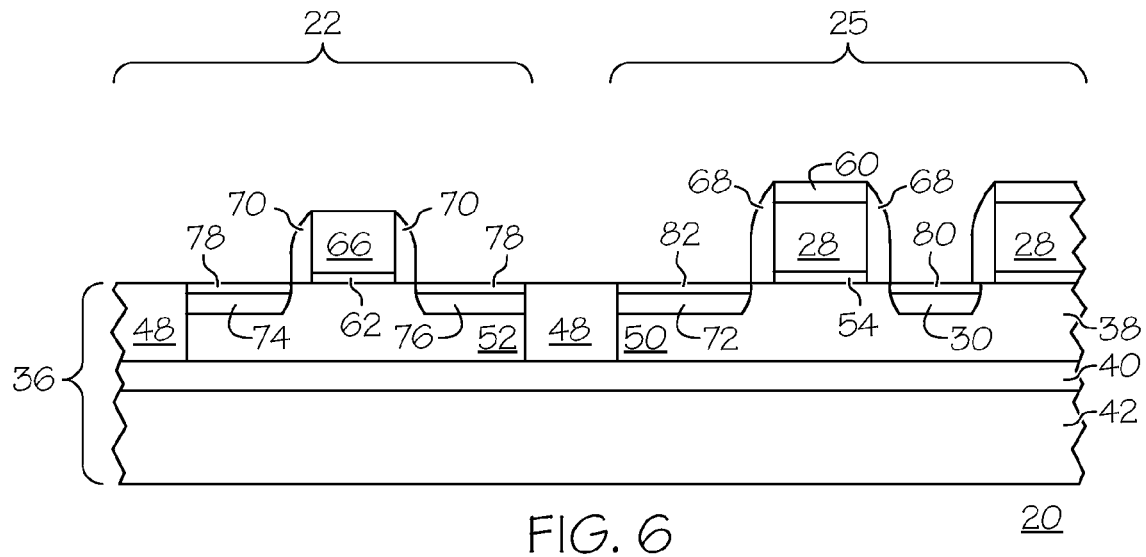

After etching to expose the surface of the source and drain regions, a layer of silicide forming metal (not illustrated) such as cobalt, nickel, rhenium, ruthenium, or palladium, or alloys of those metals, and preferably either cobalt or nickel is blanket deposited over the structure and in contact with the ion implanted areas. The silicide forming metal can be deposited, for example, by sputtering to a thickness of about 5-30 nm. The silicide forming metal is heated, for example by rapid thermal annealing (RTA) to react the silicide forming metal with exposed ion implanted silicon to form metal silicide contacts 78 on source and drain regions 74 and 76, metal silicide contact 80 on bit line 30, and metal silicide contact 82 on memory storage capacitor contact 72 as illustrated in FIG. 6. Metal that is not reacted, for example the metal in contact with the side wall spacers and STI, can be removed by wet etching in a $H_2O_2/H_2SO_4$ or $HNO_3/HCl$ solution.

Figure 7:
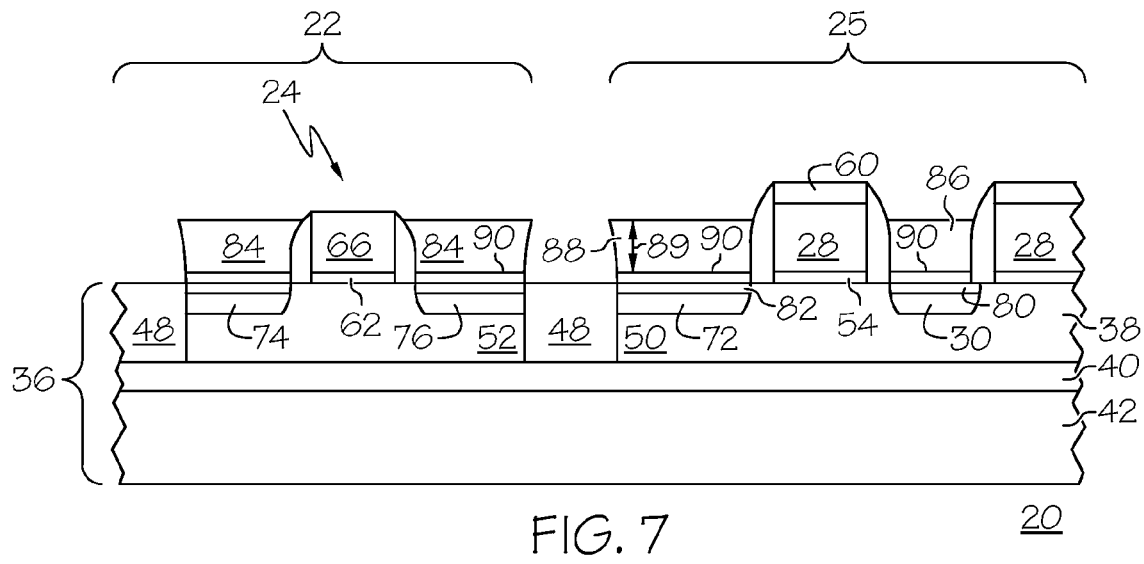

In accordance with an embodiment of the invention a layer 84, 86, 88 of metal or other conductive material is selectively deposited on the metal silicide contacts 78, 80, 82, respectively, as illustrated in FIG. 7. Preferably the selectively deposited material is a layer of cobalt tungsten deposited by electroless deposition from solution. Phosphorus and/or boron may be added to the deposited cobalt tungsten to aid in selectivity and uniformity of deposition. In a preferred embodiment a thin seed layer 90 is selectively deposited on the metal silicide layers and thicker layers 84, 86, 88 are selectively deposited on the seed layer. Seed layer 90 can be, for example, a layer of palladium having a thickness of ranging from one monolayer to about 3 nm. The seed layer of palladium is preferably deposited by electroless deposition from a solution of palladium acetate and acetic acid. Thicker layers 84, 86, 88 are preferably selectively deposited by electroless deposition from a solution such as a solution of cobalt sulphate heptahydrate, ammonium tungstate, and sodium hypophosphite with the possible addition of buffering agents, complexing agents and pH balancers. Chemicals such as dimethylamine borane can be added as a source of boron. Other electroless deposition solutions for this application, some proprietary, are available from the vendors of electroless deposition equipment. Using such a solution, metal layers 84, 86, 88 can be selectively deposited onto seed layer 90 to a thickness of about 500-800 nm indicated by arrow 89 with a solution temperature from about 65° C. to about 75° C. Exact deposition times and temperatures depend on the particular deposition solution and the particular deposition equipment that is used. Although in the preferred method seed layer 90 is preferably palladium deposited by an electroless deposition process and the thicker layers are a metal layer including at least cobalt and tungsten, the inventive method is not limited to these materials or to an electroless deposition process. Other conductive materials and other selective deposition techniques can also be used although for ease of discussion the selectively deposited conductive material will hereinafter be referred to as a metal. For example, the thicker layers can be pure tungsten deposited by a selective CVD technique. Metal silicide contacts 78, 80, 82 are self aligned to their respective ion implanted areas; selectively deposited metal layers 84, 86, 88 are also self aligned to those ion implanted areas. The selectively deposited conductive material serves to "prefill" contact openings that are subsequently formed as will be explained below.

Figure 8:
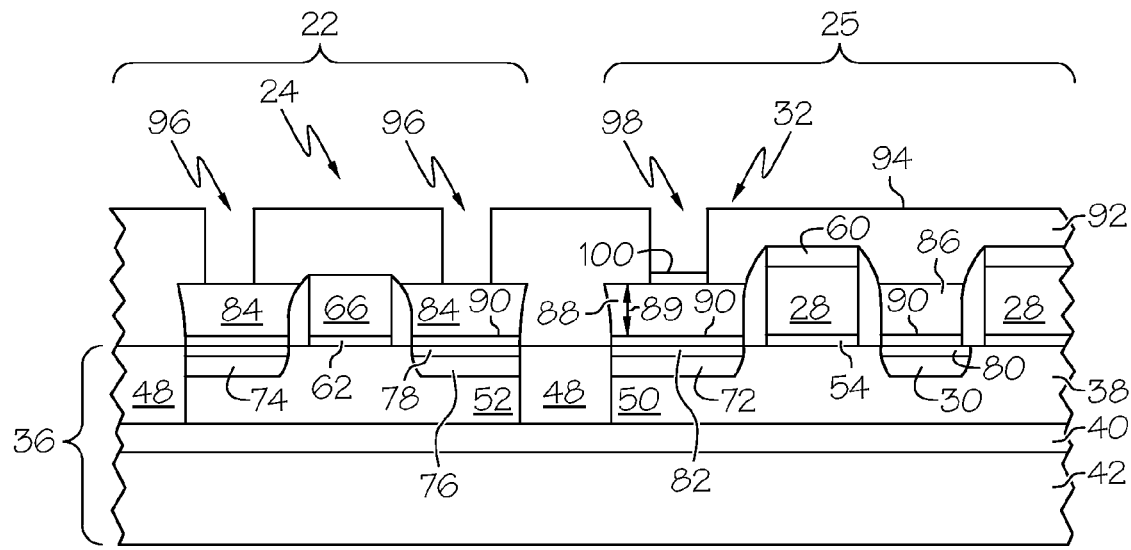

A dielectric layer 92 is deposited overlying the selectively deposited conductive material and surface 94 of the dielectric layer is preferably planarized, for example by CMP as illustrated in FIG. 8. Dielectric layer 92 is preferably deposited by CVD, LPCVD, SACVD, or PECVD to a thickness greater than the height of the word line structure. Layer 92 can be, for example, a layer of silicon oxide deposited from a tetraethylorthosilicate (TEOS) source. Contact openings 96 are etched through dielectric layer 92 to expose selectively deposited metal 84 overlying the source 74 and drain 76 regions of MOS transistor 24 and contact opening 98 is etched through dielectric layer 92 to expose selectively deposited metal 88 overlying memory storage capacitor contact 72. In accordance with one embodiment of the invention a thin layer of dielectric 100 is deposited on the portion of selectively deposited metal 88 to form the capacitor dielectric of the memory storage capacitor. Dielectric 100 is preferably a layer of high dielectric constant material such as $HfSiO_2$ or the like deposited by LPCVD. Dielectric 100 can be removed from the other contact openings by conventional photoresist patterning and etching.

Figure 9:
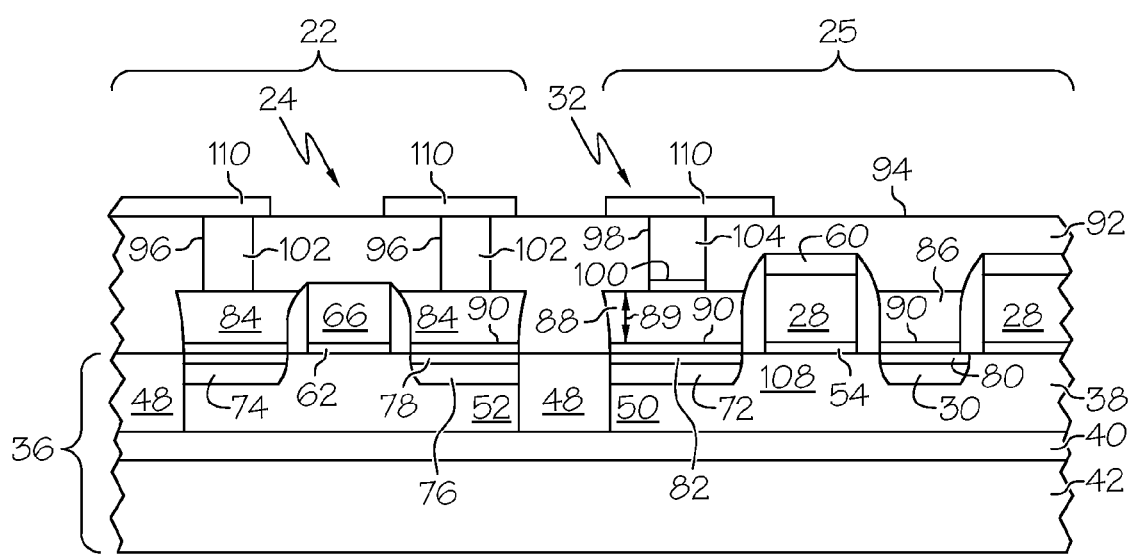

Electrically conductive plugs 102 and 104 are formed in contact openings 96 and 98, respectively, as illustrated in FIG. 9. There are a number of well know methods for forming conductive plugs. In one such method a layer of titanium is deposited, a layer of titanium nitride or other barrier layer is formed over the layer of titanium, and tungsten is deposited to fill the contact opening. The excess titanium, titanium nitride, and tungsten are removed from the surface of dielectric layer 92 by CMP. Contact plug 104 forms the top electrode of memory storage capacitor 32. The memory storage capacitor includes contact plug 104, capacitor dielectric 100, and deposited layer 88. Deposited layer 88 is electrically coupled to metal silicide contact 82 and to ion implanted contact area 72. The memory storage capacitor is selectively coupled to bit line 30 by a channel 108 in thin silicon layer 38 beneath and controlled by the potential on word line 28. A layer of interconnect metallization 110 is formed on or embedded in surface 94 of dielectric layer 92. The layer of interconnect metallization is coupled to the source and drain of logic transistor 24 to convey necessary signals to and from that transistor. The layer of interconnect metallization is also coupled to memory storage capacitor 32. The layer of interconnect metallization is typically formed of aluminum or an aluminum alloy or of copper or a copper alloy. Aluminum metallization and copper metallization are patterned by different processes; aluminum metallization is patterned by a subtractive process and copper metallization is patterned by a damascene process. Both processes are well known to those of skill in the art of semiconductor device fabrication and need not be described here.

Figure 10:
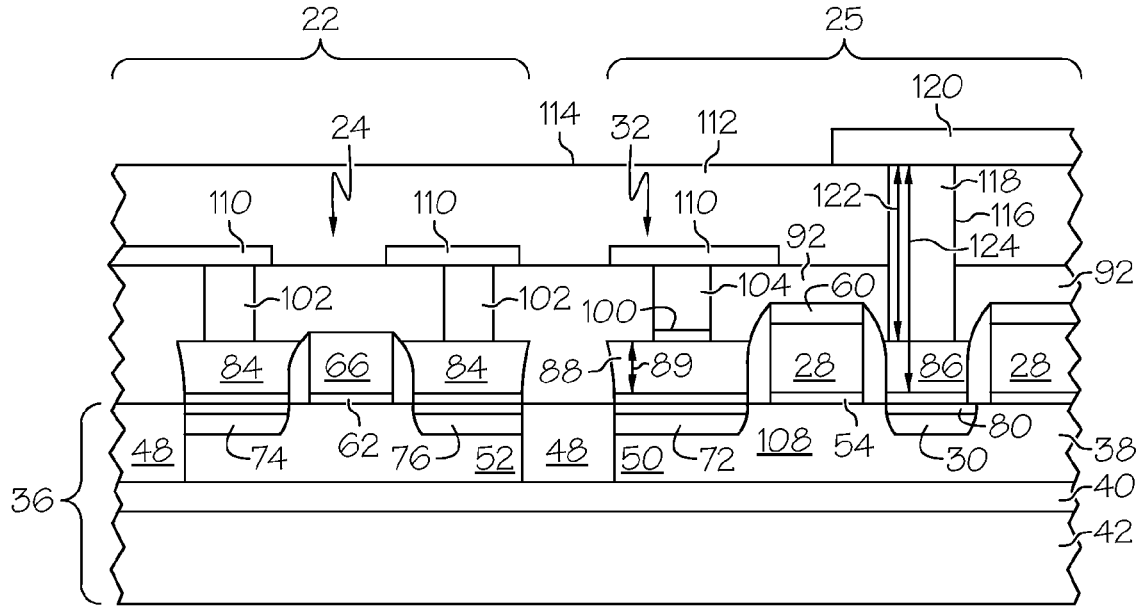

As illustrated in FIG. 10, the method continues, in accordance with an embodiment of the invention, by depositing another dielectric layer 112 overlying dielectric layer 92 and layer of interconnect metallization 110. Surface 114 of the additional dielectric layer is preferably planarized, for example by CMP. The second dielectric layer can be silicon oxide, a low dielectric constant material such as hydrogen, fluorine, carbon or nitrogen-containing silicon oxide, or other dielectric material deposited by CVD, LPCVD, SACVD, PECVD, or a spin on process to a thickness of about 30-100 nm. Contact opening 116 is etched through dielectric layer 112 and dielectric layer 92 to expose a portion of deposited metal layer 86 that is electrically coupled to bit line 30. An electrically conductive plugs 118 is formed that fills contact opening 116 and a layer of interconnect metallization 120 is deposited and patterned at surface 114 of dielectric layer 112. The contact plug can be formed, for example, in the same manner as contact plugs 102 and 104 and interconnect metallization 118 can be formed and patterned in the same manner as interconnect metallization 110. Bit line 30 is thus electrically coupled to interconnect metallization 120 through electrically conductive plug 118, selectively deposited metal layer 86 and metal silicide contact 80. By fabricating IC 20 in accordance with an embodiment of the invention the length of contact opening 116 and the height of electrically conductive plug 118, as indicated by arrow 122, is significantly less than the distance from interconnect metallization 120 and the corresponding metal silicide contact 80 as indicated by arrow 124. Preferably the thickness of selectively deposited metal layer 86 as indicated by arrow 89 is at least one third of the combined height of dielectric layer 92 and dielectric layer 112. The aspect ratio of contact opening thus is significantly reduced, and preferably is reduced by at least one third.

Figure 11:
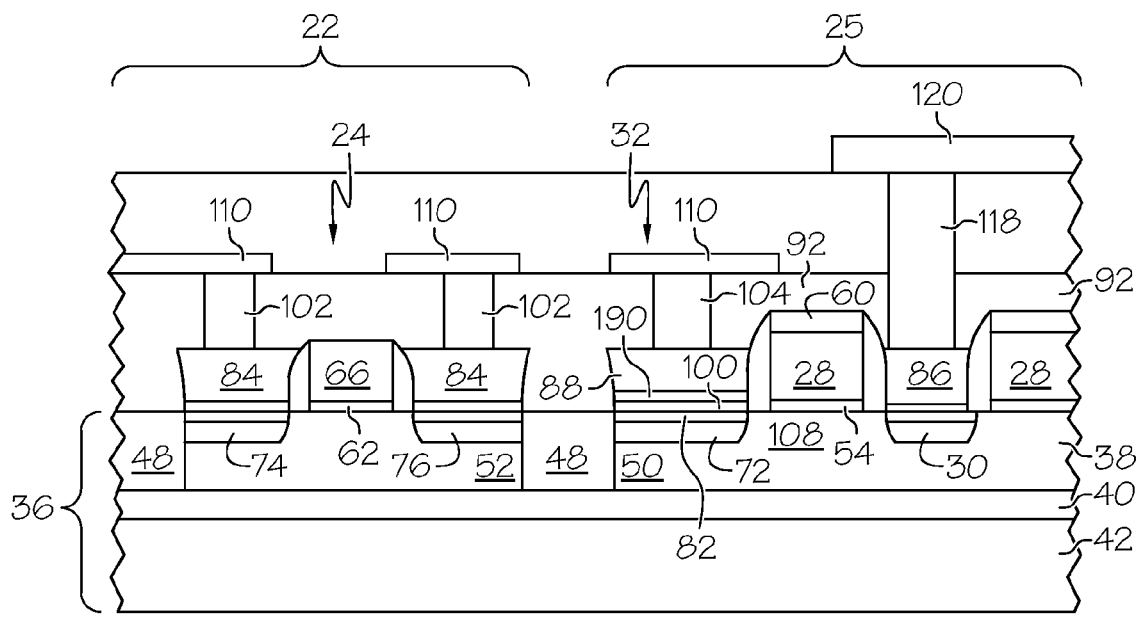
FIG. 11 illustrates, in cross section a method for fabricating an integrated circuit in accordance with a further embodiment of the invention.

In accordance with another embodiment of the invention, as illustrated in FIG. 11, integrated circuit 20 is fabricated in a similar manner except that memory storage capacitor dielectric 100 is deposited on metal silicide contact 82 before the selective deposition of metal layer 88. Memory storage capacitor 32 thus includes a bottom plate formed by metal silicide contact 82 and ion implanted memory storage capacitor contact 72, capacitor dielectric 100 and a top plate formed by selectively deposited metal layer 88. Capacitor dielectric layer 100 is deposited directly on metal silicide contact 82. A seed layer 190 of, for example, platinum is deposited onto the dielectric layer, and selectively deposited conductive material 88 is deposited on the seed layer in the same manner as described above. The remainder of the method is the same as previously described.

Those of skill in the art will understand that many additional layers of interconnect metallization and additional layers of ILD may be required to complete integrated circuit 20. Some of those additional layers of interconnect metallization may be positioned between interconnect metallization layers 110 and 120. Additional layers only make the problem of high aspect ratio contacts even more severe and the advantage provided by the current invention more valuable. Although the various embodiments of the invention have been described and illustrated with reference to a combination logic circuit and memory circuit and specifically to a microprocessor that includes embedded DRAM, the invention is also applicable to any circuit having high aspect ratio contacts. The invention is applicable, for example in any circuit in which a contact must extend from an upper layer of interconnect metallization to a device region separated from the interconnect metallization by one or more intervening layers of conductive or insulating material.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a microprocessor integrated circuit including embedded DRAM, the method comprising the steps of:
    fabricating a logic portion of the integrated circuit comprising a plurality of logic contact pads;
    fabricating a DRAM portion of the integrated circuit comprising a word line, a bit line, a memory capacitor, a bit line contact pad electrically coupled to the bit line, and a capacitor contact pad;
    forming metal silicide contacts to the plurality of logic contact pads, the bit line contact pad, and the memory capacitor contact pad;
    forming metal plugs by a process of electroless plating overlying and electrically coupled to the metal silicide contacts; and
    forming conductive plugs overlying the metal plugs.

2. The method of claim 1 further comprising the step of depositing a capacitor dielectric overlying the metal plug overlying the memory capacitor pad and wherein the step of forming conductive plugs comprises the step of forming a conductive plug overlying the capacitor dielectric.

3. The method of claim 1 further comprising the steps of:
    depositing a layer of capacitor dielectric overlying the metal silicide contact to the memory capacitor contact pad; and
    depositing a metal seed layer onto the capacitor dielectric prior to the step of forming metal plugs.

4. The method of claim 3 wherein the step of depositing a metal seed layer comprises the step of depositing a layer comprising palladium.

5. The method of claim 1 further comprising the steps of:
    depositing a first layer of dielectric material overlying the metal plugs;
    etching first openings extending through the first layer of dielectric material to expose the metal plugs overlying the plurality of logic contact pads and the memory capacitor contact pad; and
    wherein the step of forming conductive plugs comprises the step of forming first conductive plugs positioned in the first openings.

6. The method of claim 5 further comprising the steps of:
    depositing a first layer of conductive material overlying the first layer of dielectric material; and
    patterning the first layer of conductive material to form a first interconnect layer coupled to the first conductive plugs.

7. The method of claim 6 further comprising the steps of:
    depositing a second layer of dielectric material overlying the first interconnect layer;
    etching a second opening extending through the second layer of dielectric material and the first layer of dielectric material to expose the metal plug overlying the bit line contact pad;
    wherein the step of forming conductive plugs comprises the step of forming a second conductive plug in the second opening and electrically coupled to the metal plug overlying the bit line contact pad;
    depositing a second layer of conductive material overlying the second layer of dielectric material and contacting the second conductive plug; and
    patterning the second layer of conductive material to form a second interconnect layer coupled to the bit line.

8. The method of claim 1 wherein the step of forming metal plugs comprises the step of depositing by electroless deposition metal plugs comprising cobalt and tungsten.

9. A method for fabricating an integrated circuit comprising the steps of:
    forming a plurality of device regions in and on a silicon substrate, the plurality of device regions comprising a first group of device regions to be contacted by a first level of metal and a second group of device regions to be contacted by a second level of metal, the first level of metal separated from the second level of metal by at least one layer of dielectric material;
    forming a first metal silicide contact on each of the first group of device regions and a second metal silicide contact on each of the second group of device regions;
    electroless plating a first layer of conductive material overlying each of the first metal silicide contacts and a second layer of conductive material overlying each of the second metal silicide contacts, the first layer of conductive material and the second layer of conductive material each having a first thickness;
    forming first conductive plugs overlying the first layer of conductive material and second conductive plugs overlying the second layer of conductive material and forming a first layer of interconnect metal contacting the first conductive plugs and a second layer of interconnect metal contacting the second conductive plugs, the first layer of interconnect metal separated from the second layer of interconnect metal by at least one layer of dielectric material.

10. The method of claim 9 further comprising the steps of:
    depositing a first layer of dielectric material overlying the first layer of conductive material and the second layer of conductive material;
    etching first openings through the first layer of dielectric material to expose the first layer of conductive material; and
    forming the first conductive plugs in the first openings.

11. The method of claim 10 further comprising the steps of:
    depositing a second layer of dielectric material overlying the first layer of dielectric material, the first layer of dielectric material and the second layer of dielectric material having a combined thickness less than three time the first thickness;
    etching second opening extending through the second layer of dielectric material and the first layer of dielectric material to expose the second layer of conductive material; and
    depositing the second layer of interconnect metal overlying the second layer of dielectric material.

12. The method of claim 9 further comprising the step of forming a capacitor dielectric overlying the first layer of conductive material and wherein the step of forming first conductive plugs comprises the step of forming first conductive plugs overlying the capacitor dielectric.

13. The method of claim 9 further comprising the steps of:
    forming a capacitor dielectric overlying one of the first metal silicide contacts;
    depositing a plating nucleation layer overlying the capacitor dielectric; and wherein the step of electroless plating a first layer comprises the step of electroless plating a first layer contacting the plating nucleation layer.

14. A method for fabricating an integrated circuit in and on a silicon substrate, the method comprising the steps of:
implanting dopant ions into a logic portion of the silicon substrate to form a source region and a drain region of a logic transistor;
implanting dopant ions into a memory portion of the silicon substrate to form a bit line and a first portion of a memory capacitor of a memory cell;
forming a metal silicide contacts to the source region, the drain region, the bit line and the first portion;
selectively depositing metal plugs contacting each of the metal silicide contacts;
depositing a first dielectric layer and etching first openings through the first dielectric layer to expose the metal plugs overlying the source region, the drain region, and the first portion;
depositing and patterning a first layer of conductive material to form a first interconnect layer coupled to the metal plugs overlying the source region, the drain region, and the first portion;
depositing a second dielectric layer and etching a second opening through the second dielectric layer and the first dielectric layer to expose the metal plug overlying the bit line; and
depositing and patterning a second layer of conductive material to form a second interconnect layer coupled to the metal plug overlying the bit line.

15. The method of claim 14 further comprising the steps of:
forming first conductive plugs in the first openings; and
forming a second conductive plug in the second opening.

16. The method of claim 15 further comprising the step of depositing a capacitor dielectric overlying the metal plug overlying the first portion and wherein the step of forming one of the first conductive plugs comprises the step of forming the one of the first conductive plugs overlying the capacitor dielectric.

17. The method of claim 14 further comprising the step of forming a capacitor dielectric overlying the metal silicide contact to the first portion.

18. The method of claim 14 wherein the step of selectively depositing metal plugs comprises the step of electroless plating metal plugs.

19. The method of claim 18 wherein the step of electroless plating comprises the step of electroless plating metal plugs comprising cobalt and tungsten.

20. The method of claim 18 wherein the step of electroless plating metal plugs comprises the step of electroless plating metal plugs having a thickness of about 50-80 nm.

* * * * *